United States Patent [19]

Schweitzer, Jr.

[11] Patent Number: 4,904,932
[45] Date of Patent: Feb. 27, 1990

[54] CIRCUIT CONDITION MONITOR WITH INTEGRALLY MOLDED TEST POINT SOCKET AND CAPACITIVE COUPLING

[75] Inventor: Edmund O. Schweitzer, Jr., Northbrook, Ill.

[73] Assignee: E. O. Schweitzer Manufacturing Co., Inc., Mundelein, Ill.

[21] Appl. No.: 253,427

[22] Filed: Oct. 4, 1988

Related U.S. Application Data

[63] Continuation of Ser. No. 62,875, Jun. 16, 1987, abandoned.

[51] Int. Cl.⁴ .............. G01R 1/04; G01R 31/00; H02G 15/08
[52] U.S. Cl. .................. 324/133; 324/522; 324/156; 361/372; 174/11 BH; 340/664
[58] Field of Search ............... 324/519, 522, 524, 126, 324/129, 133, 149, 156; 340/664; 174/11 BH; 361/372, 380

[56] References Cited

U.S. PATENT DOCUMENTS

| | | | |
|---|---|---|---|
| 3,443,158 | 5/1969 | Arndt | 317/18 |
| 3,513,394 | 5/1970 | Tochick | 324/133 |
| 3,524,133 | 8/1970 | Arndt | 324/102 |
| 3,657,650 | 4/1972 | Arndt | 324/126 |
| 3,939,412 | 2/1976 | Hermstein et al. | 324/96 |
| 4,152,643 | 5/1979 | Schweitzer, Jr. | 324/120 |
| 4,234,847 | 11/1980 | Schweitzer, Jr. | 324/146 |
| 4,251,770 | 2/1981 | Schweitzer, Jr. | 324/133 |
| 4,263,550 | 4/1981 | Schweitzer, Jr. | 324/133 |

*Primary Examiner*—Reinhard J. Eisenzopf
*Assistant Examiner*—Jack B. Harvey
*Attorney, Agent, or Firm*—Lockwood, Alex, FitzGibbon & Cummings

[57] ABSTRACT

A circuit condition monitoring system for an electrical power distribution system includes a system connector component having an integrally molded test point socket within which a circuit module is received to provide fault current or voltage loss monitoring of a system conductor within the connector. The test point socket provides capacitive coupling to the monitored conductor without the use of a metallic test point, and a ground return to the electrically conductive outer sheath of the connector. An electrically conductive end cap may be provided to cover the projecting end of the module when the module is installed in the socket. Adapters installed on the other end of the module enable the module to be installed on prior metallic contact-type test points.

37 Claims, 6 Drawing Sheets

CIRCUIT CONDITION MONITOR WITH INTEGRALLY MOLDED TEST POINT SOCKET AND CAPACITIVE COUPLING

This application is a continuation, of application Ser. No. 062,875, filed June 16, 1987, now abandoned.

BACKGROUND OF THE INVENTION

The present invention is directed generally to circuit condition monitoring systems for power distribution systems, and more particularly to a connector component for such systems having an integral test point socket for receiving a circuit condition test module.

In the operation of electrical power distribution systems it is frequently necessary to monitor circuit parameters such as current and voltage at a particular location to detect the occurrence of a fault current or loss of voltage at the location. To this end, distribution systems have been provided with test points at various locations by means of which monitoring devices such as fault indicators are capacitively coupled to conductors of the systems. Typically, such test points are in the form of exposed metallic contacts imbedded in the housing of a system connector component, such as elbow-type connectors illustrated, for example, in U.S. Pat. Nos. 4,263,550 and 4,375,617 of the present inventor, and available commercially, for example, as the Elastimold type 376LR connector, or similar connector manufactured by RTE Corporation. Such elbow connectors are typically used for connecting a system cable to the terminal of a system component, such as a transformer or relay.

Various types of circuit condition indicating modules have been installed on such test points, including, for example, fault indicators as described in U.S. Pat. Nos. 4,234,847, 4,438,403, 4,424,512 and 4,458,198 of the present inventor, and voltage indicators as described in U.S. Pat. Nos. 4,152,643, 4,251,770, 4,550,288 and 4,641,220 of the present inventor.

One drawback of prior test point constructions is the use of the metallic contact on the surface of the connector. This not only increases the cost of manufacture of the test point, but also creates a need to cap the contact when the test point was not in use to avoid the perception of a shock hazard. The present invention provides a system for monitoring voltage and/or current on a system conductor which by providing a test point socket of novel construction avoids the need for an exposed metallic contact and the attendant complexity of construction. The system further provides a circuit condition monitoring module which can be installed on prior metallic contact-type test points as well as on test point sockets constructed in accordance with the invention, and which in at least one embodiment completely avoids the need for exposed contacts on the module housing thereof.

SUMMARY OF THE INVENTION

The invention is directed to a connector for establishing a monitored electrical connection between electrical terminals of components of an electrical power distribution system. The connector includes a connector body formed of electrically non-conductive material, first and second terminal means for electrically and mechanically engaging the electrical terminals of the components, electrical conductor means extending within the body portion between the first and second terminal means for providing an electrical current path therebetween, the conductor means being substantially surrounded by the body portion, and a sheath formed of an electrically-conductive material overlying the surface of the body portion. A recess forming a test point socket is defined on the outside surface of the connector for receiving a circuit condition indicating module, the sidewalls of the socket being formed primarily of the electrically-conductive material of the sheath, and at least a portion of the bottom of the test point socket being formed of the non-electrically conductive material of the connector body, whereby the monitoring module when received within the test point socket is capacitively coupled to the monitored conductor.

The invention is further directed to a circuit condition monitoring system for an electrical power distribution system for providing a monitored connection between the terminals of electrical component of the distribution system. The system comprises a connector body formed of electrically non-conductive material, first and second terminal means for electrically and mechanically engaging the electrical terminals of the system components, electrical conductor means extending within the body between the first and second terminal means for providing an electrical current path therebetween, said conductor means being substantially surrounded by the body portion, and a sheath formed of an electrically-conductive material overlying the surface of the body portion. A recess is defined on the surface of the connector forms a test point socket for receiving a circuit condition indicating module, the sidewalls of the socket being formed primarily of the electrically-conductive material of the sheath, and at least a portion of the bottom of the test point socket being formed of the non-electrically conductive material of the connector body whereby the monitoring module when received within the test point socket is capacitively coupled to the monitored conductor. A circuit condition monitoring module operable from a capacitive coupling to the conductor and a ground return connection is provided. The module includes a capacitive coupling plate at one end for interacting with the coupling means, and ground coupling means for establishing a ground return connection. The test point socket is dimensioned to receive the module with the one end thereof extending directly toward the conductor means, and the ground coupling means coupling to the sidewall of the test point socket, whereby, in the presence of an alternating voltage on the conductor, a voltage is induced within the module.

A circuit condition monitoring module for installation in a test point socket having a side-wall at least partially electrically conductive and connected to ground, and a bottom end at least partially electrically non-conductive, and in proximity to a monitored electrical conductor, comprises a circuit condition monitoring circuit operable from an applied alternating voltage, a housing formed of electrically non-conductive material for containing the circuitry, the housing being dimensioned to fit within the test point socket with an interior end thereof adjacent the bottom end, a first capacitive coupling element within the housing at the interior end thereof for electrically coupling the monitoring circuit to the monitored conductor, and ground return coupling means for electrically coupling the monitoring circuit to ground whereby the circuit is powered by alternating current on the monitored conductor.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Referring to the drawings, and particularly to FIGS. 1-4, a plug-in type elbow connector for use in high voltage alternating current power distribution systems for establishing a plug-in connection to a transformer or other system component (not shown) is identified generally by reference numeral 10. As shown, the connector 10 includes generally a conductor 11 extending generally axially through an electrically non-conductive body portion 12 encased in an electrically-conductive sheath 13, the sheath being grounded in accordance with conventional practice. An electrically-conductive contact member 14 extends from conductor 11 to mate with a complementary contact on the associated system component. An arcuate member 15 having ends anchored in the conductive sheath 13 extends from the connector to receive the hooked end of a lineman's tool. The axial conductor 11 is connected, in accordance with conventional practice, to the conductor 16 of a flexible cable 17 of the type commonly utilized in power distribution systems. A layer 18 of semi-conductive material may be provided around conductor 11 to provide stress relief within the conductor in a manner well known to the art.

Figures 1, 2, 3:
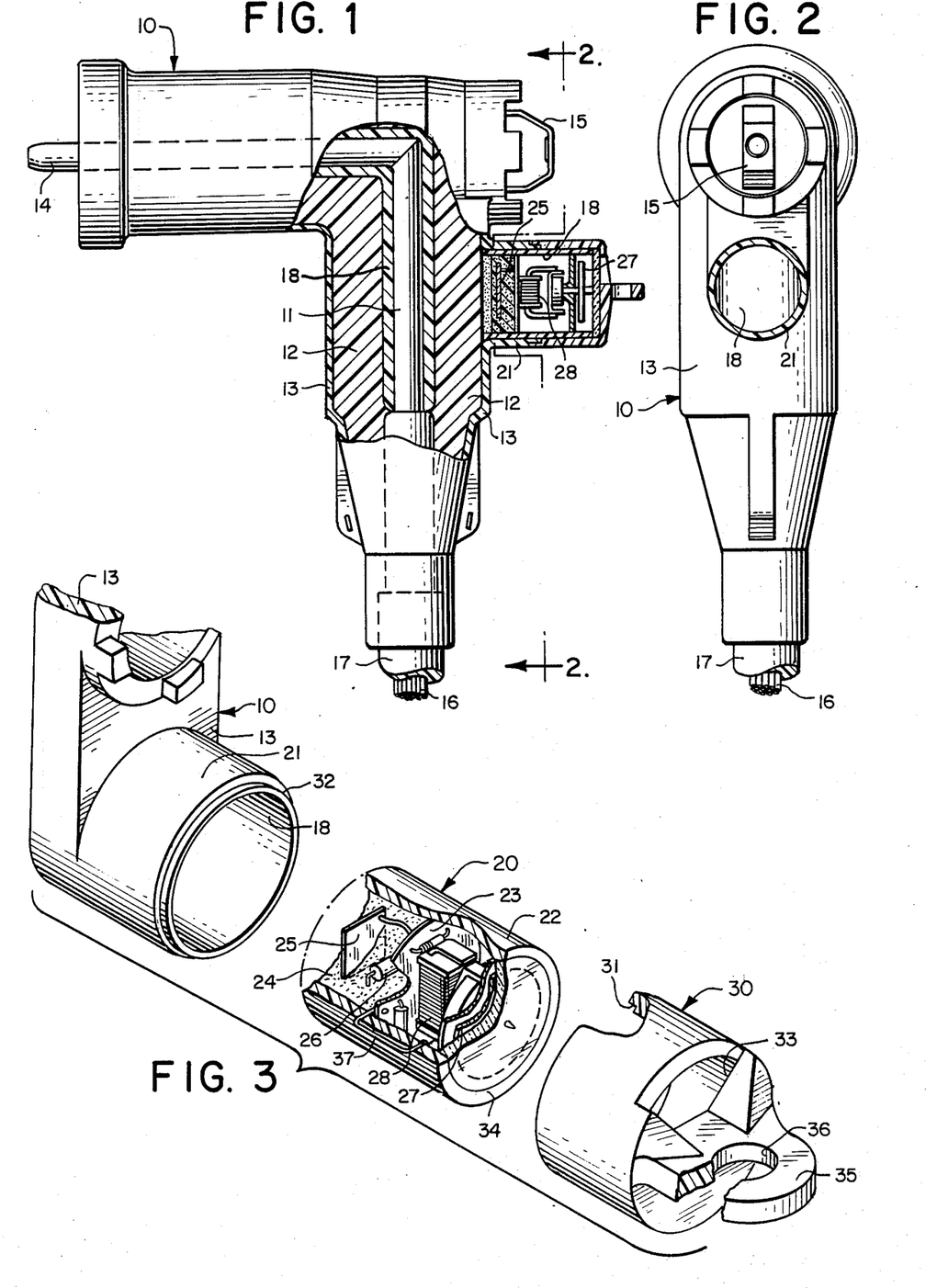
FIG. 1 is a side elevational view partially in section of an elbow-type connector including a test point socket and installed fault indicator module constructed in accordance with the invention.
FIG. 2 is a cross-sectional view of the front of the elbow connector taken along line 2—2 of FIG. 1.
FIG. 3 is an enlarged exploded perspective view showing the test point socket, fault indicator module and protective end cap of the circuit condition monitoring system of the invention.
Figure 4:
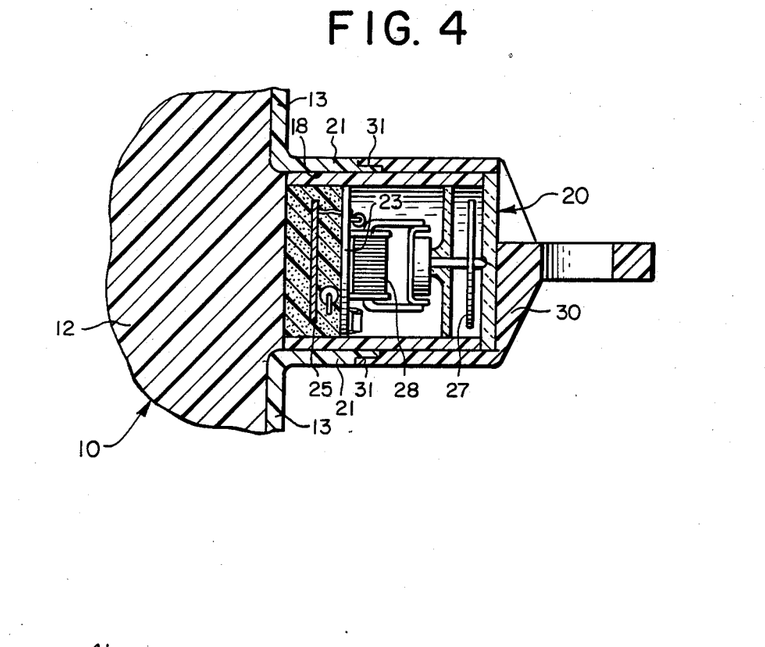
FIG. 4 is an enlarged cross-sectional view showing the test point socket and installed fault indicator module of the elbow connector of FIG. 1.

To provide for detecting fault currents or voltage loss in conductor 11 connector 10 includes, in accordance with the invention, a test point socket 18 for receiving a circuit condition indicating module, in this case a fault indicator module 20. The test point socket 18 may preferably be formed by a portion of the electrically-conductive outer sheath 13 which projects radially from the central axis of a central body portion of the connector. In particular, this projecting portion 21 is preferably cylindrical in form and of an axial extent such that the depth of test point socket 18 is approximately half the length of fault indicator module 20. Thus, when module 20 is seated in the test point socket 18 as shown in FIG. 4 approximately half of the module is received within the socket. Since test point socket 18 is formed by the electrically conductive sheath 13 the sidewalls of the socket are electrically conductive. However, since sheath 13 does not extend across the bottom of socket 18 the bottom of the socket is not electrically conductive.

The fault indicator module 20, which is representative of various other types of circuit condition monitoring modules which can be used in conjunction with the test point socket, is seen to include an electrically non-conductive transparent plastic housing 22 within which the electrical components of the fault indicator are contained. In particular, within housing 22 the fault indicator module includes a disc-shaped insulator board 23 positioned perpendicularly to the axis of the housing at a location intermediate the ends thereof, and a layer 24 of epoxy material at the inside end of the housing for securing the insulator board in place. Additional electrical components included in housing 22 include a first capacitive coupling element in the form of a metallic plate 25 for capacitively coupling the circuitry of the fault indicator to conductor 11, a reed switch 26 for sensing the occurrence of a fault current in the conductor, an electro-mechanical indicator flag assembly 27 for visually indicating the occurrence of a fault current through the transparent outside end of housing 22, and a magnetic winding assembly 28 for actuating the indicator flag assembly.

The fault indicator module 20 may be protected by an electrically-conductive semi-flexible rubber end cap 30 which is dimensioned to slide over the projecting outside end of module housing 22. The axial length of end cap 30 is such that when the end cap is fitted over housing 22 as shown in FIG. 4 and the module is seated in test point socket 18, the rim portion 31 of cap 30 is caused to engage the rim portion 32 of the test point socket. To this end, rim portion 31 may include an annular overlying flange which slides over a complementarily dimensioned underlying flange on rim portion 32, as best shown in FIG. 4. A window 33 in end cap 30 allows the user to view indicator flag assembly 27 through the transparent end 34 of housing 22. A tab portion 35 at the closed end of end cap 30 having an aperture 36 therethrough is provided to facilitate the removal of the fault indicator module from connector 10 with a conventional lineman's tool.

Operating power for the circuitry of fault indicator module 20 is derived from conductor 11 by means of the metallic plate 25, which when module 20 is seated in test point socket 18 is sufficiently closely spaced to the conductor to provide a level of capacitive coupling whereby adequate alternating voltage is derived from the conductor for operation of the fault indicator circuitry. A necessary ground return for this circuitry may be provided, as shown in FIGS. 1-5, by an electrical conductor 37 which extends through the sidewall of housing 22 and along the outside sidewall of the housing. When housing 22 is seated in test point socket 18 conductor 37 is brought into electrical communication with the electrically-conductive sidewall of the socket, thus establishing the ground return through the electrically grounded sheath 13 of the connector.

By reason of the novel construction of test point socket 18, connector 10 is manufactured without the use of a metallic contact member such as utilized in prior connector constructions. Instead, the connector has on its exterior surface only the test point socket formed of electrically-conductive rubber sheath material. Since sheath 13 does not extend across the bottom of the socket any circuit condition monitoring module (such as fault indicator module 20) seated in the socket is automatically coupled by means of its internal metallic plate 25 to conductor 11. The surrounding electrically-conductive sheath material of the sleeve portion 21 of the test point socket provides an efficient ground return path which may conveniently established by either an exposed conductor, such as conductor 37 on the exterior of housing 22, or by a second capacitive coupling element, as will be described in connection with FIGS. 14 and 15.

Figure 5:
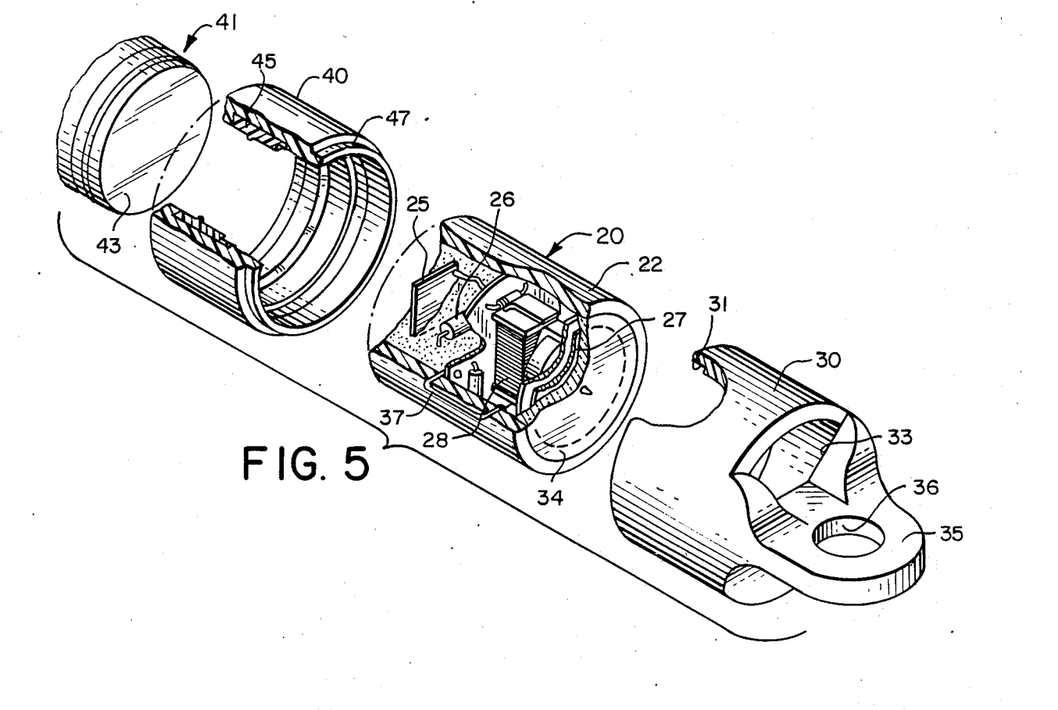
FIG. 5 is an enlarged exploded perspective partially fragmented view showing the fault indicator module and protective end cap of FIG. 3 combined with an adapter sleeve for installation on a conventional prior design metallic contact-type, test point.
Figures 6, 7:
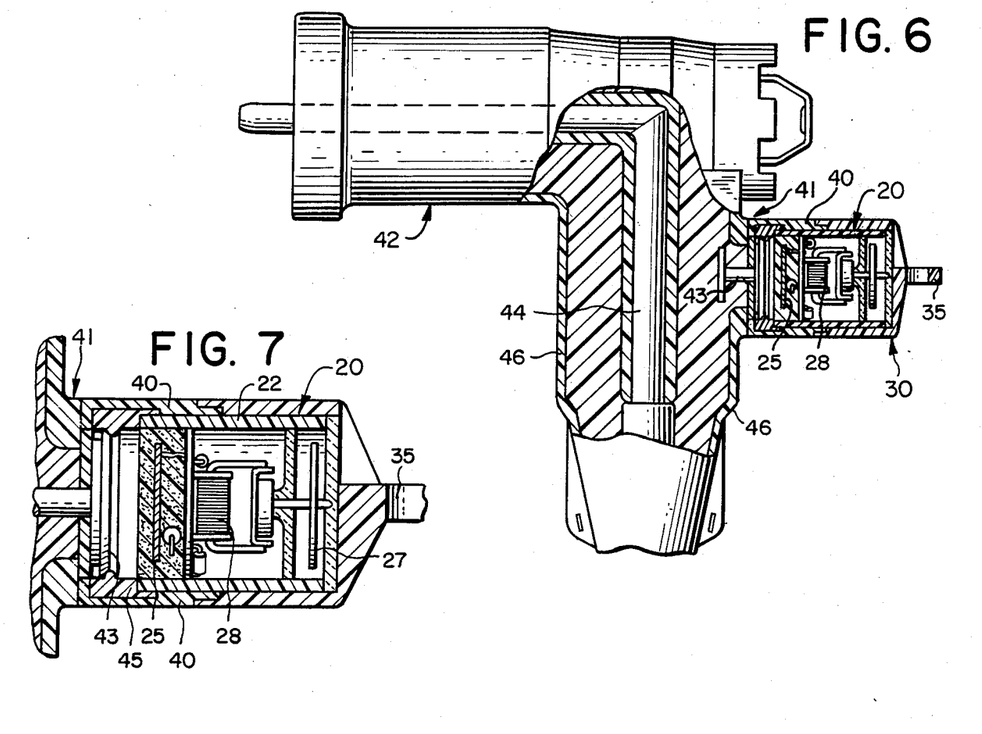
FIG. 6 is a side elevational view partially in section showing a conventional elbow connector of prior construction wherein a fault indicator module, protective end cap and adapter sleeve have been installed in accordance with the invention.
FIG. 7 is an enlarged cross-sectional view showing the fault indicator module, protective end cap and adapter sleeve of FIG. 6.

In accordance with another aspect of the invention, the same circuit condition monitoring module 20 and protective end cap 30 utilized in conjunction with test point socket 18 can be utilized in conjunction with prior connectors using a metallic-contact type test point. To this end, the monitoring system of the invention utilizes, as shown in FIGS. 5-7, an adapter sleeve 40 which is dimensioned to fit over the inside end of housing 22 and extend between end cap 30, when installed on the housing, and the metallic test point 41 of a prior connector 42. As best shown in FIG. 7, connector 42 includes a conventional metallic contact 43 which is exposed at test point 41 to provide capacitive coupling to a conductor 44. Contact 43 forms an annular flange at test point 41. The adapter sleeve 40, which is formed of electrically-conductive rubber, includes an electrically non-conductive interior sleeve insert 45 which engages the annular flange of contact 43 to maintain the adapter in position.

The adequate excitation for the fault indicator module circuitry is obtained, in accordance with the invention, by capacitive coupling between metallic plate 25 and embedded contact 43, and between the embedded contact and conductor 44. The conductive body portion of sleeve 40 is in contact with the electrically conductive sheath 46 of connector 42 to provide a ground return path for fault indicator module 20 in the manner previously described. The non-conductive interior sleeve 45 prevents contact 43 from being grounded to the body of sleeve 40. An annular rim portion 47 on sleeve 40 engages the rim portion 31 of end cap 30 when module 20 is installed on the test point, as shown in FIGS. 6 and 7.

Figures 8, 9:
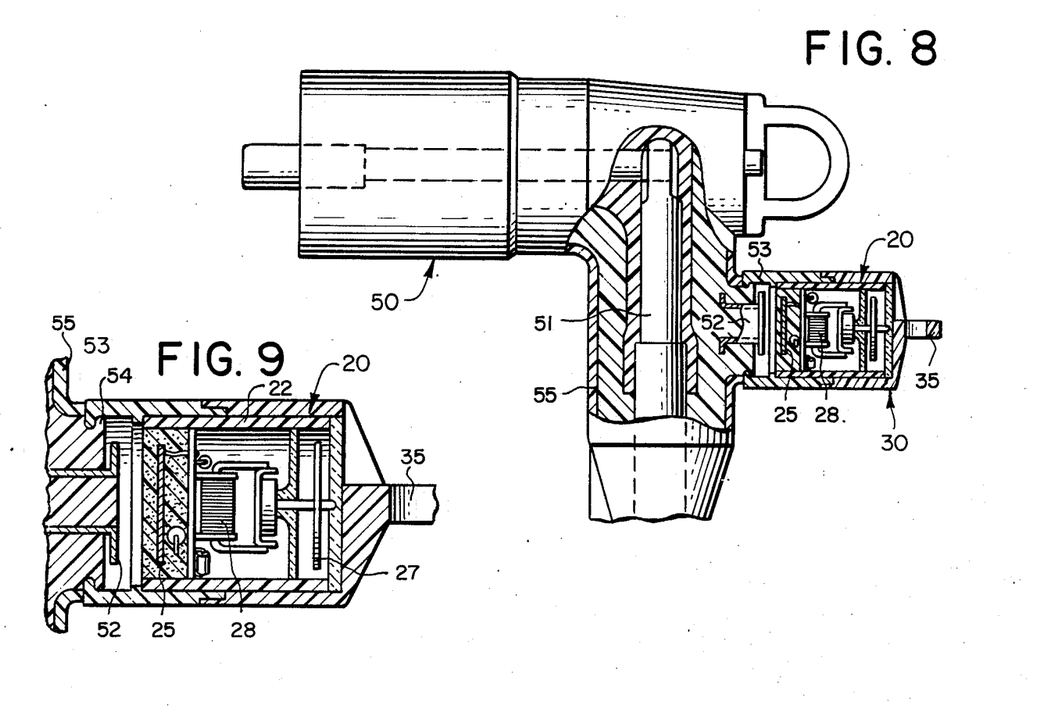
FIG. 8 is a side elevational view partially in section showing a conventional elbow connector of alternate prior construction to that shown in FIG. 6 wherein a fault indicator module, protective end cap and alternate adapter sleeve have been installed in accordance with the invention.
FIG. 9 is an enlarged cross-sectional view of the fault indicator module, protective end cap and alternate adapter sleeve shown in FIG. 8.

By reason of the use of other adapter sleeves other prior test point constructions can be accommodated by the circuit condition module of the invention. For example, in FIGS. 8 and 9 an alternate prior test point construction is shown wherein a connector 50 having a central conductor 51 has a generally washer-shaped metallic contact 52 embedded in a projecting test point portion 53 of the connector. In this instance, an alternate form of sleeve shaped adapter 53 engages a rim portion 54 molded into the connector housing. No connection is made between the adapter sleeve 53 and contact 52. An annular rim portion on the sleeve assures a secure engagement with connector 50 and the necessary ground return path is established through the electrically conductive sheath 55 of the connector. As before, adequate AC excitation for the fault indicator module circuitry is achieved in accordance with the invention, by capacitive coupling between the metallic plate 25 and the embedded contact 52, and between the embedded contact and conductor 51 of connector 50.

With the exception of the provision of specifics for coupling to a monitored conductor and to ground, fault indicator module 20 may be conventional in construction and operation. In particular, to provide an indication of the occurrence of a fault current in conductor 11, the fault indicator includes, as part of the previously identified flag indicator assembly 27, a disc-shaped target 65 which is mounted for rotation on a pivot 66. The face of the target disc has a red segment 65a (FIGS. 10-12) and a white segment 65b, only one of which is visible at a time through window 33 and the transparent end 34 of housing 22.

Figure 10A:
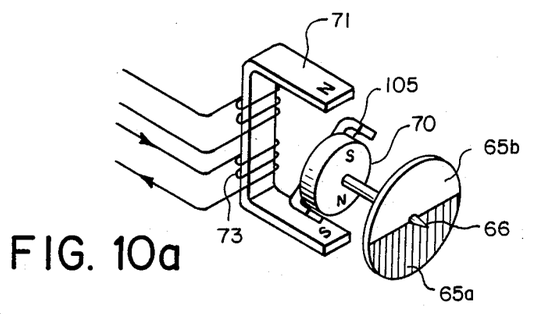
FIGS. 10a and 10b are diagrammatic views of the principal components of the indicator flag assembly of the fault indicator module set in a reset state.
Figure 10B:
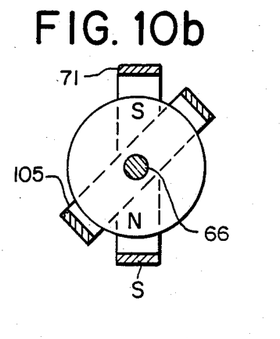
Figure 11A:
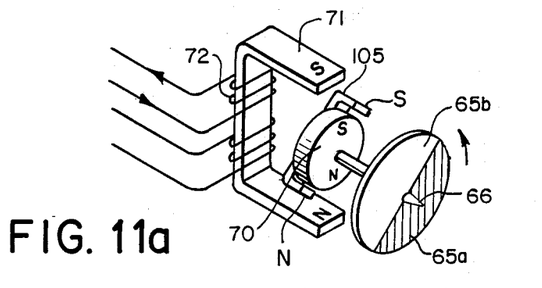
FIGS. 11a and 11b are diagrammatic views similar to FIGS. 10a and 10b, respectively, showing the principal components of the indicator flag assembly in transition between a reset state and a trip state.
Figure 11B:
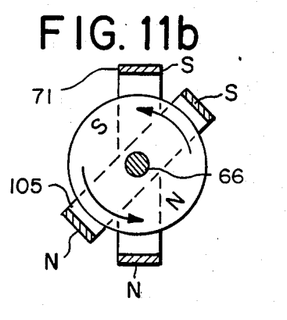
Figure 12A:
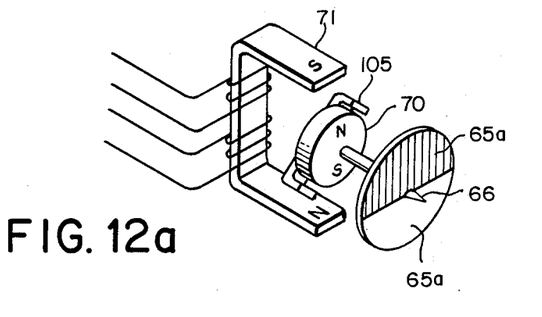
FIGS. 12a and 12b are diagrammatic views similar to FIG. 10a and 10b, respectively, showing the principal components of the indicator flag assembly in a trip state.
Figure 12B:
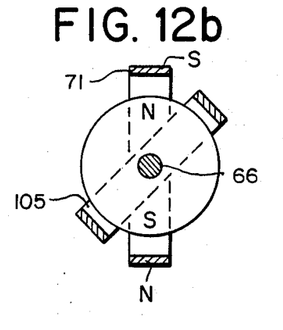

Secured to and pivotal with target 65 is a target permanent magnet 70, which is formed of a magnetic material having a high coercive force, such as ceramic, and is magnetically polarized to form two magnetic poles of opposite gender, as indicated in FIGS. 10-12, with opposite magnetic polarities along a diameter of the magnet. The target disc 65 and its permanent magnet 70 are biased to the position shown in FIGS. 10a and 10b when the fault indicator is in a non-tripped or reset condition by means of a stationary U-shaped magnetic pole piece 71, which is preferably formed of a magnetic material having a relatively low coercive force, such as a chrome steel.

When the fault indicator is in a reset state, the projecting ends of the pole piece are biased to the magnetic polarities indicated in FIGS. 10a and 10b. As a result, the opposite polarity magnetic poles of the target magnet 70 are attracted to position the target disc 65 as shown. In this position the red segment 65a of the target disc is not visible through window 33, and all that is seen is the white segment 65b.

On the occurrence of a fault current in conductor 11, which fault current may, for example, exceed 400 amperes, pole piece 71 is remagnetized to the magnetic polarities shown in FIGS. 11 and 12 by momentary energization of a trip winding 72 on the center section of the pole piece. As a result, the poles of magnet 70 are repelled by the adjacent like gender poles of the pole piece and the target disc is caused to rotate 180° to the tripped position shown in FIGS. 12a and 12b. In this position, the red segment 65a of the target disc is visible through window 33, and a lineman viewing the fault indicator is advised that a fault current has flowed through conductor 11.

The target disc remains in the fault indicating position until the ends of pole piece 71 are subsequently remagnetized to the magnetic polarities shown in FIGS. 10a and 10b by momentary energization of a reset winding 73 on the enter section of the pole piece. As a result, the target magnet 70, and hence the target disc 65, are caused to rotate from the tripped position shown in FIG. 12 to the reset position shown in FIG. 10 and the fault indicator is conditioned to respond to a subsequent fault current.

Figure 13:
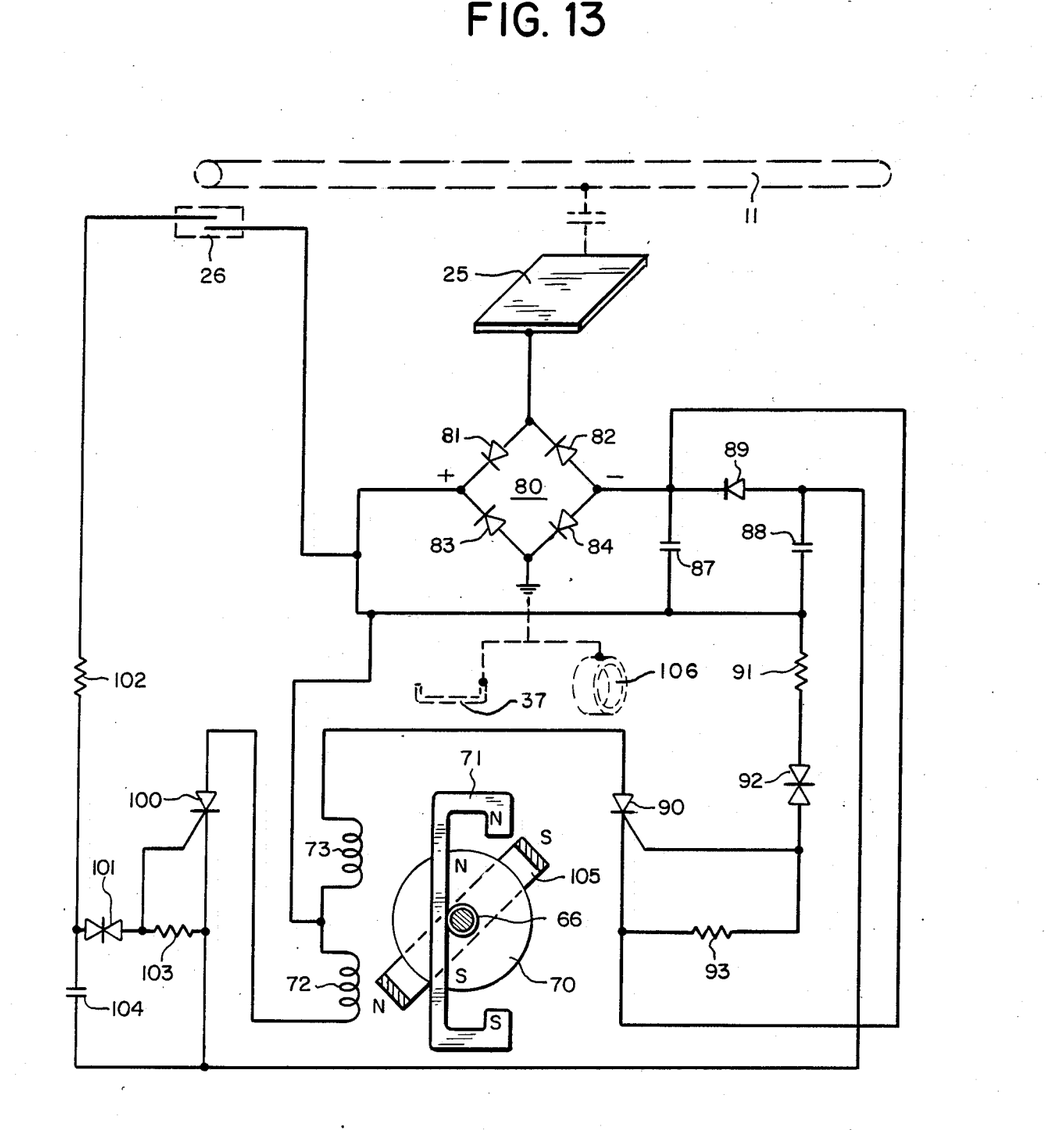
FIG. 13 is an electrical schematic diagram of the circuitry of the fault indicator module of FIGS. 1-9.
Figures 14, 15, 16, 17, 18:
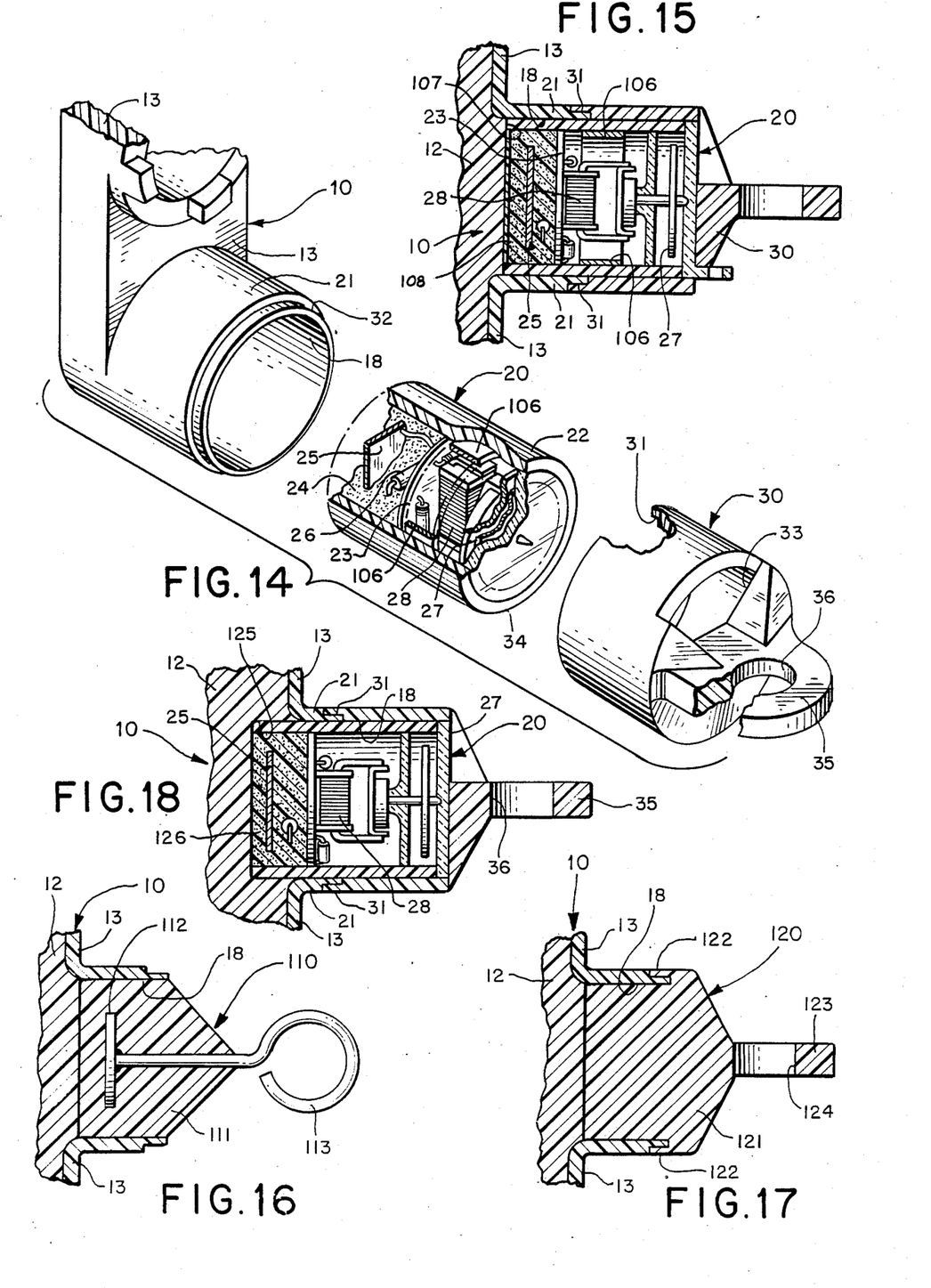
FIG. 14 is an exploded perspective view similar to FIG. 3 showing an alternate construction for a fault indicator module constructed in accordance with the invention.
FIG. 15 is an enlarged cross-sectional view of the fault indicator module of FIG. 14.
FIG. 16 is a cross-sectional view of a test adapter for a test point socket constructed in accordance with the invention.
FIG. 17 is a cross-sectional view of a plug for inserting in a test point socket constructed in accordance with the invention.
FIG. 18 is a cross-sectional view of an alternate construction for a test point socket constructed in accordance with the invention.

Energization of winding 72 upon occurrence of a fault current in conductor 11, and energization of winding 73 upon restoration of current in conductor 11 following a fault, is accomplished by means of circuitry contained within the fault indicator housing 22. Referring to the schematic diagram shown in FIG. 13, windings 72 and 73 are connected end-to end for independent energization upon occurrence of fault and reset conditions, respectively. Operating power for these windings is obtained by means of a bridge rectifier network 80, consisting of diodes 81-84. One input terminal of this network, formed at the juncture of the anode of diode 81 and the cathode of diode 82, is connected to the capacitive coupling plate 25. The other input terminal, formed at the juncture of the anode of diode 83 and the cathode of diode 84, is coupled to ground through the electrically conductive sheath 13 of connector 10, either by direct connection, as shown in FIGS. 1-5, or by capacitive coupling, as shown in FIG. 18. With this arrangement, high voltage alternating current carried in conductor 11 is capacitively coupled to the bridge rectifier network, resulting in the production of a pulsating unidirectional current at the output terminals of the network.

The positive polarity output terminal of the bridge rectifier network, formed at the cathodes of diodes 81 and 83, is connected to one contact of a reed switch 26, to the end terminals of windings 72 and 73, and to respective terminals of capacitors 87 and 88. The negative polarity output terminal of the bridge rectifier network, formed at the juncture of the anodes of diodes 82 and 84, is connected directly to the remaining terminal of capacitor 87, and through a forward-biased diode 89 to the remaining terminal of capacitor 88. With this arrangement, capacitors 87 and 88 are charged by the pulsating unidirectional current developed by bridge rectifier network 80 in the presence of voltage on conductor 11.

To provide for periodic energization of reset winding 73 during normal current flow in conductor 11, the remaining end terminal of winding 73 is connected through a silicon controlled rectifier (SCR) 90 to the negative polarity terminal of capacitor 87. Periodic conduction through SCR 90 is obtained by connecting the gate electrode of that device to the positive polarity output terminal of bridge rectifier network 80 through a resistor 91 and a bilateral diode 92, and to the cathode of SCR 90 by a resistor 93. With this arrangement, SCR 90 is periodically triggered into conduction when the voltage developed across bilateral diode 92 as a result of capacitor 87 being charged by bridge rectifier 80 reaches the threshold level of the bilateral diode.

In operation, under normal current flow conditions, the voltage developed across capacitor 87 as the capacitor is charged by bridge rectifier network 80 progressively increases with time, until the threshold breakdown voltage of bilateral diode 92 is reached, at which time SCR 90 is triggered and capacitor 87 discharges through winding 73. Diode 89 prevents capacitor 88 from being discharged through SCR 90 and winding 73, leaving the capacitor available for energizing winding 72 in response to a fault condition. In practice, the breakdown voltage of bilateral diode 92 may be in the order of 34 volts, and the time required for capacitor 88 to reach this threshold level with a voltage level of 4,400 volts on conductor 11 may be approximately 2 minutes. In any case, the voltage level within conductor 11 is not critical to the operation of the reset circuit, and has only the effect of changing the frequency of the reset cycle.

Trip winding 72 is energized upon occurrence of a fault current in conductor 11 by discharge of capacitor 88 through a second silicon controlled rectifier 100. Conduction is established through SCR 100 by closure of the contacts of reed switch 26, which is positioned within housing 22 so as to be in proximity to conductor 11 when the module is seated in test socket 18. The gate electrode of SCR 100 is connected through a bilateral diode 101 and a resistor 102 to the contacts of reed switch 86, and by a resistor 103 to the SCR cathode. The juncture of resistor and bilateral diode 104 is connected by a capacitor 104 to capacitor 88.

Upon occurrence of a fault current in conductor 11, the positive polarity output terminal of bridge rectifier network 80 is connected through the then closed contacts of reed switch 26 and the circuit comprising resistor 102, bilateral diode 101, resistor 103, and capacitor 104 to the gate electrode of SCR 100, causing that device to be rendered conductive following a predetermined time delay. At this time capacitors 87 and 88 are caused to discharge through SCR 100 and energize winding 82. The resulting magnetic flux in the U-shaped pole piece 71 reverses the magnetic pole polarities of the pole piece and causes rotation of the target as previously described.

To avoid the possibility of rotor 85 becoming stalled upon reversal of the magnetic polarities of pole piece 71, as might happen with a rotor being perfectly centered between the poles of pole pieces 71 and having a degree of bearing friction, the fault indicator includes an auxiliary U-shaped pole piece 110 positioned adjacent target means 70 coaxial with and at an angle to pole piece 71.

The existence of a magnetic field between the poles of pole piece 71 results in the production of induced magnetic poles on auxiliary pole piece 110 of opposite gender to the most adjacent poles of pole piece 71. This is illustrated in FIGS. 10–12 and results by reason of the auxiliary pole piece 110 becoming included in the magnetic flux path between the poles of pole piece 71. The effect of the induced magnetic poles is that upon reversal of the gender of the poles of pole piece 80 following occurrence of a fault current the auxiliary poles exert a rotational force on the most adjacent poles of the permanent rotor magnet 70 associated with target 65. This results in a rotational moment being exerted on the target, tending to turn the target in a predetermined (counter-clockwise in FIGS. 10–12) direction such that the target is precluded from remaining in its reset position, even if it should be perfectly positioned and have a degree of bearing friction. Once rotation has been established, as shown in FIG. 11, the greater force of the main pole piece 71 overcomes the effect of the auxiliary pole piece 110 and rotation continues until the target is aligned as shown in FIG. 12.

Other fault indicator circuits having different or additional operating features, such as the fault indicator circuits described in the copending applications of the present inventor, Ser. No. 042,282, filed Apr. 24, 1987, entitled "Fault Indicator Having Delayed Trip Circuit", and Ser. No. 518,535, filed Aug. 29, 1983 entitled, "Fault Indicator Having Trip Inhibit Circuit", may be utilized in place of the circuit shown by replacing the prior spring contact metallic coupling element with a capacitive coupling element, and adapting the ground return means in accordance with the intended use.

In an alternative embodiment of the invention shown in FIGS. 14 and 15 the external wire 37 utilized to establish electrical communication with the sidewall of test point socket 18 is replaced by a second capacitive coupling element in the form of a brass ring or cylinder 106 on the inside surface of housing 22. This ring capacitively couples the fault indicator circuitry through the housing wall to the electrically conductive socket sidewall 21 and the overlying cap member 30, which are connected to ground through sheath layer 13. Thus, the requisite ground return path is established without an external contact on the housing. Since the coupling to conductor 11 is also obtained in accordance with the invention, without an external contact the fault indicator module is desirably entirely free of exposed contacts.

While a ring shaped coupling element 106 has been shown, it will be appreciated that other constructions for this element are possible, including a single plate positioned against the inside surface of the module housing opposite sidewall 21.

As shown in FIG. 15, should an electrically conductive surface be desired on the bottom wall 107 of test point socket 18 for any reason, it would be possible to deposit or otherwise apply thin resistive coating 108 formed of a conductive paint or rubber on the bottom wall 107 provided such coating does not contact the electrically conductive sidewalls 21 of the socket.

In certain applications, such as where test equipment is to be temporarily coupled to a monitored conductor, a contact assembly 110 can be temporarily inserted in test point socket 18 to provide a metallic test point to which the instrumentation can be connected. In particular, as shown in FIG. 16, the contact assembly may include a body 111 formed of electrically non-conductive rubber dimensioned to fit within the socket. A metallic capacitive coupling element in the form of a plate 112 is positioned within the body so as to couple to conductor 11, while avoiding contact with the electrically conductive sidewalls of the socket. A combination electrical terminal and hook member 113 extends axially within housing 111 from plate 112 to a location external to the housing, where it can be connected to or used to install or remove the contact assembly.

When the test point socket is not in use it may be desirable to install a plug member in the socket. This not only prevents the collection of dirt in the socket, but also eliminates any perception of a shock hazard from the exposed bottom wall of the housing. As shown in FIG. 17, the plug member, generally designated 120, may comprise an electrically conductive rubber body 121 have a rim portion formed therein for engaging the rim portion 32 of test point socket 18, and a projecting handle portion 123 having an aperture 124 for engagement with the hook end of a conventional lineman's tool.

In a further modification of the invention shown in FIG. 18, the coupling between the fault indicator circuit and monitored conductor 11 is increased by forming test point socket 18 partially in the body portion of the connector. Consequently, when the fault indicator is seated in the body portion 125 of the socket, against the recessed bottom surface 126, the capacitive coupling plate 25 of the module is positioned closer to conductor 11. All other construction features of the invention may remain unchanged, and the alternate constructions of FIGS. 14 and 15, the test adapter of FIG. 16 and the electrically conductive cap member 121 remain applicable.

The components of the circuit condition monitoring system of the invention may be manufactured using conventional techniques and materials. In particular, connector 10 may have an insulating layer formed of EPDM material and conductive sheath formed of the same material impregnated with carbon. The module housing may be formed of Lexan (Trademark of General Electric Company) or an acrylic, and the end cap and adapter may be formed of a carbon-impregnated EPDM rubber.

Thus, a system has been shown which incorporates a novel test point socket in a connector by which various circuit condition monitoring modules can be brought into electrical communication with a monitored conductor without the need for providing exposed electrical contacts for securing capacitive coupling to the conductor. Moreover, a novel construction for the circuit condition monitoring module has been shown which enables the module, when used in conjunction with appropriate adapter sleeves, to be installed on either a test point socket constructed in accordance with the invention, or on a prior test point construction of the type having an exposed metallic contact. No changes are required in the module and the need for exposed contacts on the module is obviated in favor of internal capacitive coupling means.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A connector for establishing an electrical connection between the electrical terminals of components of an electrical distribution system, said connection being monitored by a removable circuit condition monitoring module requiring simultaneous electrical coupling to said electrical connection and to electrical ground, said connector comprising:
- a connector body portion formed of electrically non-conductive material;
- first and second terminal means for electrically and mechanically engaging the electrical terminals of said components;
- electrical conductor means extending within said body portion between said first and second terminal means for providing an electrical current path therebetween, said conductor means being substantially surrounded by said body portion;
- an electrically grounded sheath layer formed of an electrically-conductive material overlying the surface of said body portion;
- means defining on the surface of said connector a recess forming a test point socket for receiving the circuit condition monitoring module, at least a portion of the bottom of said test point socket being formed of said electrically non-conductive material of said body portion said test point socket further being complementarily dimensioned to the circuit condition monitoring module whereby the monitoring module, when received in said socket, is fixedly positioned and simultaneously electrically coupled through said non-conductive body portion to said monitored conductor means and through said sheath layer to electrical ground.

2. A connector as defined in claim 1 wherein the circuit condition monitoring module and said test point socket are generally cylindrical in form and aligned generally radially relative to said conductor means.

3. A connector as defined in claim 1 wherein at least a portion of said test point socket is formed of said electrically conductive material and the circuit condition monitoring module is coupled through said conductive portion to ground.

4. A connector as defined in claim 3 wherein said conductive portion comprises at least a portion of the sidewall of said test point socket.

5. A connector as defined in claim 3 wherein the circuit condition monitoring module includes a capacitive coupling electrode for establishing electrical coupling to electrical ground, and said electrically conductive portion of said test point socket is capacitively coupled thereto when the module is seated in said test point socket.

6. A connector as defined in claim 5 wherein said electrically conductive portion of said test point socket comprises a portion of the sidewall of said socket.

7. A connector as defined in claim 5 wherein the bottom of said test point socket is flat and formed substantially of said non-conductive material of said body portion, and the monitoring module has a complementary flat end surface.

8. A connector as defined in claim 1 wherein said test point socket includes around the open end thereof a rim portion formed at least partially of said electrically conductive material of said sheath layer, said rim portion being dimensioned to mechanically engage the circuit condition monitoring module when seated in the test point socket whereby an ohmic connection is established between said module and ground.

9. A connector as defined in claim 8 wherein the circuit condition monitoring module includes an electrically conductive housing, and said rim portion is dimensioned to mechanically and electrically engage said housing.

10. A connector as defined in claim 8 including a removable plug member formed of an electrically conductive material dimensioned when seated in said test point socket to extend from the bottom of said socket to the open end thereof in mechanical and electrical engagement with said sheath layer whereby the electric field of said conductor means is contained within the connector.

11. A connector as defined in claim 1 wherein at least a portion of the exterior surface of the circuit condition monitoring module received in said test point socket is electrically conductive and in ohmic contact with said sheath layer when the module is seated in said socket.

12. A connector as defined in claim 11 wherein at least a portion of the sidewall of said test point socket is formed by said sheath layer, and said conductive portion of said exterior surface of said module is in ohmic electrical communication therewith.

13. A connector for an electrical power distribution system for establishing an electrical connection between terminals of components of the system said connection being monitored by a removable circuit condition monitoring module requiring capacitive coupling at one end thereof to said electrical connection and ohmic electrical connection between an electrically conductive portion along the side thereof and electrical ground, said connector comprising:
- a connector body portion formed of electrically non-conductive material;
- first and second terminal means for electrically and mechanically engaging the component terminals;
- electrical conductor means extending within said connector body portion between said first and second terminal means for providing an electrical current path therebetween, said conductor means being surrounded by said body;
- an electrically grounded sheath layer formed of electrically-conductive material overlying said body;
- means defining on the surface of said connector a recess defining a test point socket extending from said surface in a generally radial direction relative to said conductor means for receiving the circuit condition monitoring module; and
- at least a portion of the bottom of said test point socket being formed of said electrically non-conductive material of said connector body portion, said test point socket further being complementarily dimensioned to the circuit condition monitoring module whereby said module when received within said test point socket is fixedly positioned relative to said body portion, capacitively coupled to said conductor means and ohmically connected to said sheath layer.

14. A connector as defined in claim 13 wherein said test point socket includes around the open end thereof a rim portion formed at least partially of said electrically conductive material of said sheath layer, said rim portion being dimensioned to mechanically engage the circuit condition monitoring module when seated in the test point socket.

15. A connector as defined in claim 14 wherein the circuit condition monitoring module includes an electrically conductive housing, and said rim portion is dimensioned to mechanically and electrically engage said housing.

16. A circuit condition monitoring system for an electrical power distribution system providing a monitored connection between the terminals of electrical components within the distribution system, said system comprising:
a connector including a body portion formed of electrically non-conductive material;
first and second terminal means for electrically and mechanically engaging the component terminals;
electrical conductor means extending within said body portion between said first and second terminal means for providing an electrical current path therebetween, said conductor means being substantially surrounded by said body portion;
said connector further including an electrically grounded sheath layer formed of an electrically-conductive material overlying the surface of said body portion;
a circuit condition monitoring module including a monitoring circuit operable from a capacitive coupling to said conductor means and an electrical coupling to electrical ground;
means defining on the surface of said connector a recess forming a test point socket for receiving said circuit condition monitoring module, at least a portion of the bottom of said test point socket being formed of said electrically non-conductive material of said connector body portion, said test point socket being complementarily dimensioned to said circuit condition monitoring module whereby said monitoring module when received within said test point socket is fixedly positioned and simultaneously capacitively coupled to said monitored conductor and electrically coupled to electrical ground.

17. A monitoring system as defined in claim 16 wherein said circuit condition monitoring module includes an internal capacitive coupling element at one end for establishing said capacitive coupling to said conductor when said module is seated in said test point socket, and ground return means for establishing electrical coupling between said monitoring module and ground, said test point socket is dimensioned to receive said monitoring module with said one end thereof extending toward said conductor means and said ground return means being operable through said sheath layer, whereby in the presence of an alternating current voltage on said conductor a voltage is induced within said module.

18. A monitoring system as defined in claim 16 wherein the circuit condition monitoring module and said test point socket are generally cylindrical in form and aligned generally radially relative to said conductor means.

19. A monitoring system as defined in claim 16 wherein at least a portion of said test point socket is formed of said electrically conductive material and the circuit condition monitoring module is coupled through said conductive portion to ground.

20. A monitoring system as defined in claim 19 wherein said conductive portion comprises at least a portion of the sidewall of said test point socket.

21. A monitoring system as defined in claim 19 wherein the circuit condition monitoring module includes a capacitive coupling electrode for establishing electrical coupling to electrical ground, and said electrically conductive portion of said test point socket is capacitively coupled thereto when the module is seated in said test point socket.

22. A monitoring system as defined in claim 21 wherein said electrically conductive portion of said test point socket comprises a portion of the sidewall of said socket.

23. A monitoring system as defined in claim 22 wherein said capacitive coupling electrode comprises a metallic ring within said module.

24. A monitoring system as defined in claim 19 wherein said test point socket includes around the open end thereof a rim portion formed at least partially of said electrically conductive material of said sheath layer, said rim portion being dimensioned to mechanically engage the circuit condition monitoring module when seated in the test point socket whereby an ohmic connection is established between said module and ground.

25. A monitoring system as defined in claim 24 wherein the circuit condition indicating module includes an electrically conductive housing, and said rim portion is dimensioned to mechanically and electrically engage said housing.

26. A monitoring system as defined in claim 24 including a removable plug member formed of an electrically conductive material dimensioned when seated in said test point socket to extend from the bottom: of said socket to the open end thereof in mechanical and electrical engagement with said sheath layer whereby the electric field of said conductor means is contained within the connector.

27. A monitoring system as defined in claim 16 wherein at least a portion of the exterior surface of the circuit condition monitoring module received in said test point socket is electrically conductive and in ohmic contact with said sheath layer when the module is seated in said socket.

28. A connector as defined in claim 27 wherein at least a portion of the sidewall of said test point socket is formed by said sheath layer, and said conductive portion of said exterior surface of said module is in ohmic electrical communication therewith.

29. A monitoring system as defined in' claim 16 wherein the bottom of said test point socket is flat and formed substantially of said non-conductive material of said body portion, and the monitoring module has a complementary flat end surface.

30. A monitoring system providing a monitored connection between the terminals of electrical components within an electrical power distribution system, said system comprising:
a connector including a body portion formed of electrically non-conductive material;
first and second terminal means for electrically and mechanically engaging the component terminals;
electrical conductor means extending generally axially within said body portion between said first and second terminal means for providing an electrical current path therebetween, said conductor means being surrounded by said body portion;
said connector further including an electrically grounded sheath layer formed of electrically-conductive material overlying said body portion;
a circuit condition monitoring module operable from a capacitive coupling to said conductor means, and an ohmic electrical connection to ground;

means defining on the surface of said connector a recess forming a test point socket aligned in a generally radial direction relative to said conductor means for receiving said circuit condition monitoring module, at least a portion of the bottom of said recess being formed of said electrically non-conductive material of said connector body portion, said test point socket further being complementarily dimensioned to said circuit condition monitoring module whereby said monitoring module when received within said test point socket is fixedly positioned relative to said body portion, capacitively coupled to said conductor means and ohmically coupled to said sheath layer.

31. A monitoring system as defined in claim 30 wherein said test point socket includes around the open end thereof a rim portion formed at least partially of said electrically conductive material of said sheath layer, said rim portion being dimensioned to mechanically engage the circuit condition monitoring module when seated in the test point socket.

32. A monitoring system as defined in claim 31 wherein the circuit condition monitoring module includes an electrically conductive housing, and said rim portion is dimensioned to mechanically and electrically engage said housing.

33. A circuit condition monitoring module for installation on a connector having an electric conductor, a non-conductive body portion over the conductor, an electrically conductive sheath layer overlying the body portion and a test point socket formed in the sheath layer, the test point socket having a bottom end within the electric field of the conductor and being formed at least in part of the electrically non-conductive material forming the connector body portion, said module comprising:
   a circuit condition monitoring circuit operable from an applied alternating voltage;
   a housing for containing said circuit, said housing being dimensioned to fit within said test point socket with an interior end thereof adjacent the bottom end of the socket;
   first electrical coupling means comprising a capacitive coupling element within said housing at said interior end thereof for electrically coupling said monitoring circuit to the monitored conductor; and
   second electrical coupling means for electrically coupling said monitoring circuit to the sheath layer whereby said monitoring circuit is powered by alternating current on the monitored conductor when seated in the test point socket.

34. A circuit condition monitoring module as defined in claim 33 wherein said capacitive coupling element comprises a metallic plate positioned at the interior end of said housing.

35. A circuit condition monitoring module as defined in claim 33 wherein at least a portion of the sidewall of said housing is electrically conductive, and said second electrical coupling means comprise a capacitive coupling element for coupling said circuit to said electrically conductive portion of said sidewall of the test point socket.

36. A circuit condition monitoring module as defined in claim 33 wherein said second electrical coupling means comprise an ohmic electrical connection between said monitoring circuit and said electrically conductive portion of said sidewall of the test point socket.

37. A circuit condition monitoring module for installation on a connector having an electric conductor, a non-conductive body portion overlying the conductor, an electrically conductive sheath layer overlying the body portion, and a test point socket formed in the sheath layer, the socket having a bottom end within the electric field of the conductor and being formed at least in part of the electrically non-conductive material forming the connector housing, said module comprising:
   a circuit condition monitoring circuit operable from an applied alternating voltage;
   a housing formed of electrically non-conductive material for containing said circuit, said housing being dimensioned to fit within said test point socket with the interior end of said housing adjacent said bottom end of the test point socket;
   a first capacitive coupling plate within said housing adjacent said interior end thereof for electrically coupling said monitoring circuit to the monitored conductor; and
   ground return coupling means comprising a capacitive coupling ring around the inside surface of said housing at an axially-spaced location relative to said capacitive coupling plate for coupling said monitoring circuit to he electrically conductive sheath layer of said connector when the module is seated in said test point socket whereby said circuit is powered by alternating current on the monitored conductor.

* * * * *